(12) United States Patent
Hsing Chen et al.

(10) Patent No.: US 9,299,895 B1
(45) Date of Patent: Mar. 29, 2016

(54) PACKAGE STRUCTURE OF ENHANCED LUMEN LIGHT EMITTING DIODE

(71) Applicant: ProLight Opto Technology Corporation, TaoYuan County (TW)

(72) Inventors: Chen-Lun Hsing Chen, TaoYuan County (TW); Jung-Hao Hung, TaoYuan County (TW); Meng-Ting Hsieh, TaoYuan County (TW)

(73) Assignee: PROLIGHT OPTO TECHNOLOGY CORPORATION, Taoyuan County (TW)

( * ) Notice: Subject to any disclaimer, the term of this patent is extended or adjusted under 35 U.S.C. 154(b) by 0 days.

(21) Appl. No.: 14/495,898

(22) Filed: Sep. 25, 2014

(51) Int. Cl.
*H01L 33/00* (2010.01)
*H01L 33/54* (2010.01)
*H01L 33/62* (2010.01)
*H01L 33/50* (2010.01)

(52) U.S. Cl.
CPC .............. *H01L 33/54* (2013.01); *H01L 33/502* (2013.01); *H01L 33/62* (2013.01)

(58) Field of Classification Search
CPC ........ H01L 33/54; H01L 33/505; H01L 33/62
USPC ............................................................ 257/98
See application file for complete search history.

(56) References Cited

U.S. PATENT DOCUMENTS

| 7,371,593 | B2 * | 5/2008 | Harada ........................... 438/26 |
| 2003/0168720 | A1 * | 9/2003 | Kamada ........................ 257/666 |
| 2003/0214233 | A1 * | 11/2003 | Takahashi et al. ............ 313/512 |
| 2005/0127816 | A1 * | 6/2005 | Sumitani ....................... 313/498 |

* cited by examiner

*Primary Examiner* — Matthew Gordon
(74) *Attorney, Agent, or Firm* — Chun-Ming Shih; HDLS IPR Services

(57) ABSTRACT

A light emitting diode is provided. The light emitting diode comprises a lead frame, a resin base, an emitting chip and a glue. The lead frame has a plurality of electrode portions thereon. The resin base is provided on the lead frame, the resin base having an outer wall thereon and around an edge to form an opening, and the opening exposing the electrode portions; and an inner wall extending from the outer wall, and the inner side of the inner wall has a slope to decrease the inner diameter of the opening gradually. The emitting chip is attached on the top surface(s) of one or two the electrode portion(s). The glue is filled into a space between the emitting chip and the inner wall to expose the top surface of the emitting chip. Therefore, the illumination of the light emitting diode can be enhanced.

9 Claims, 9 Drawing Sheets

PACKAGE STRUCTURE OF ENHANCED LUMEN LIGHT EMITTING DIODE

BACKGROUND OF THE INVENTION

1. Field of the Invention

The invention relates to a light emitting diode (hereinafter abbreviated to "LED"), and in particular to a packaged structure of LED for enhancing lumen.

2. Brief Description of the Related Art

Currently, the known commercially available projectors comprise representative examples of 3LCD projector, digital light processing (DLP) projector and liquid crystal on silicon (LCoS) and the like. The projectors have different principles of color separation and projection. However, most projectors typically use one or more conventional white light sources, such as high pressure halogen lamps or mercuric lamps, and the white light is split into three primary colors, red, green and blue colors by dichroic mirror, panel or color wheel. Conventional white light sources are generally bulky, inefficient in emitting one or more primary colors, difficult to integrate, and tend to result in increased size and power consumption so that the projectors with conventional white light sources will not meet the portable need. Therefore, LEDs have been considered as an alternative to conventional white light sources.

LEDs with three primary colors, red, green and blue colors have the potential to provide the small size and operational lifetime that would compete with conventional light sources for a projector. Smaller and more power efficient full-color LED projectors for portable can be manufactured. In addition, the LED projectors can be turn on and off rapidly, and have no noise because the semiconductor property of LED.

However, the poor brightness of LED that results in poor resolution ratio of projecting image is a drawback for LED projectors. In addition, after die bonding and wire bonding of LED are completed, the two wires are higher than the outer wall of the resin base so that the two wires can be damaged in the subsequent processing. In the subsequent processing, glue is filled into the resin base to package the emitting chip inside the resin base, while the glue is formed as a lens of LED. The light emitted from the emitting chip may be influenced by the glue formed as a lens of LED, and the illumination of LED may be reduced.

SUMMARY OF THE INVENTION

It is an object of the invention to provide a light emitting diode (LED) to solve the above drawbacks. A packaged structure of LED of the invention with exposing the emitting chip can enhance the illumination of the light emitting diode. The packaged structure of LED of the invention is used as a white light source of a projector to enhance the quality of projection of the projector.

It is another object of the invention to provide a light emitting diode (LED). After die bonding and wire bonding of LED are completed, the two wires are not higher than the outer wall of the resin base so that the two wires will not damaged in the subsequent processing.

To achieve the above objects, the present invention provides a light emitting diode comprising: a lead frame has a plurality of electrode portions thereon, each of the electrode portions having a top surface and a bottom surface, and a gap provided between every two electrode portions; a resin base provided on the lead frame, and the bottom surfaces of the electrode portions being exposed, the resin base having an outer wall with a top portion thereon and around an edge to form an opening, and the opening exposing the top surfaces of the electrode portions; and an inner wall extending from the outer wall, and the inner wall having a planar top portion and an inner side, wherein the planar top portion and the inner side have a junction to form a first corner line, and the top portion of the inner wall is lower than the top portion of the outer wall, and the inner side of the inner wall has a slope to decrease the inner diameter of the opening gradually; an emitting chip attached on the top surface(s) of one or two the electrode portion(s), the emitting chip having a top surface, a bottom surface and two side surfaces connecting the top surface and the bottom surface, wherein the top surface and one of the side surfaces have a junction to form a second corner line; and a glue filled into a space between the emitting chip and the inner wall, the glue having a surface portion between the first corner line of the inner wall and the second corner line of the emitting chip to expose the top surface of the emitting chip.

The LED of the invention further comprises a circular groove is formed between the inner wall and the outer wall. The emitting chip is omnidirectional type, vertical cavity surface type or flip chip type. The glue is transparent, translucent, opaque or white silica gel, epoxy resin or a mixture of silica gel and epoxy resin. The emitting chip has a submount to attach the emitting chip on the top surface of the electrode portion. The emitting chip further has a fluorescent layer on the top surface wherein the fluorescent layer has a top surface, a bottom surface and two side surfaces connecting the top surface and the bottom surface, and the top surface and one of the side surfaces have a junction to form a third corner line. The top surface of the fluorescent layer is lower than the top portion of the inner wall so that the surface portion of the glue can be slanted from the first corner line of a junction of the top portion and the inner side of the inner wall to the third corner line of a junction of the top surface and the side surface of the fluorescent layer to expose the top surface of the fluorescent layer.

The LED of the invention further comprises two wire, wherein one wire is connected electrically to the top surface of the emitting chip with an end, and connected electrically to the top surface of one of the electrode portion with another end, and another wire is connected electrically to the top surface of the emitting chip with an end, and connected electrically to the top surface of another electrode portion with another end, and the two wires are not higher than the outer wall. In one embodiment, the top portion of the inner wall is higher than the top surface of the emitting chip so that the surface portion of the glue can be slanted from the first corner line of a junction of the top portion and the inner side of the inner wall to the second corner line of a junction of the top surface and one of the side surface of the emitting chip to expose the top surface of the emitting chip and a part of two wires. In another embodiment, the top surface of the emitting chip is higher than the top portion of the inner wall so that the surface portion of the glue can be slanted from the second corner line of a junction of the top surface and one of the side surface of the emitting chip to the first corner line of a junction of the top portion and the inner side of the inner wall to expose the top surface of the emitting chip and a part of two wires.

DETAILED DESCRIPTION OF THE INVENTION

Other objects and advantages of the present invention will become apparent from the detailed description to follow taken in conjunction with the appended claim.

Figure 1:
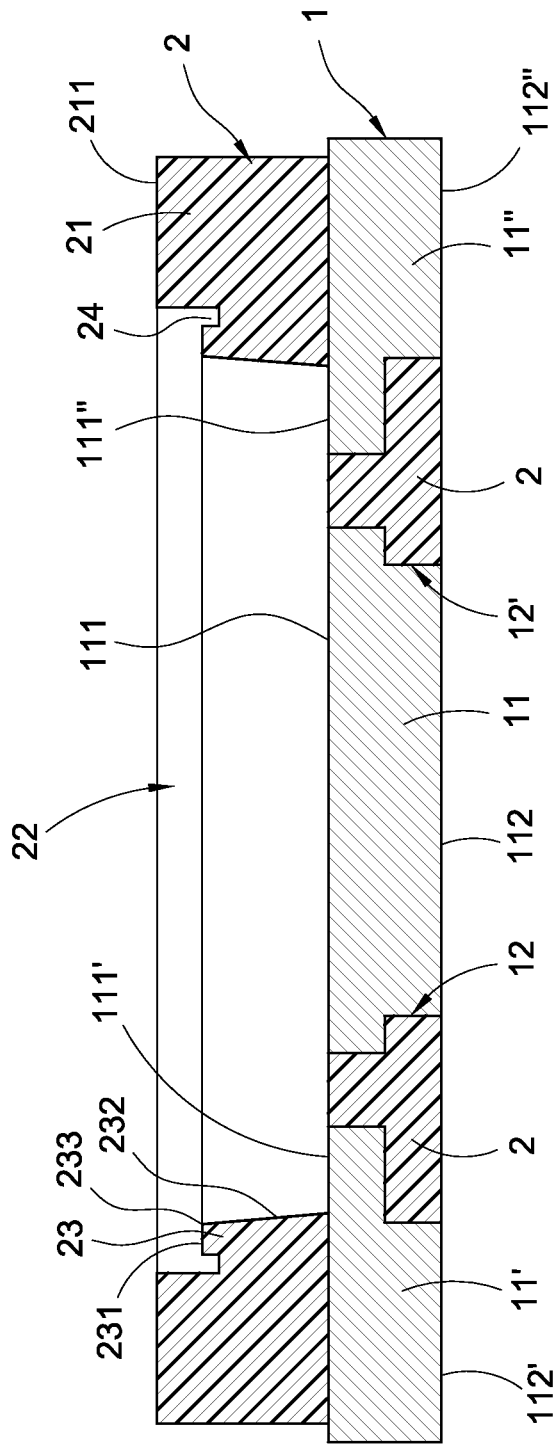
FIG. 1 is a cross sectional view of lead frame and resin base of LED according to the invention.

Please refer to FIG. 1. FIG. 1 is a cross sectional view of lead frame and resin base of LED according to the invention. As shown in FIG. 1, the invention provides a LED comprising a lead 1 and a resin base 2.

The lead frame 1 has a plurality of electrode portions 11, 11', 11" thereon. The electrode portions 11, 11', 11" respectively have top surfaces 111, 111', 111" and bottom surfaces 112, 112' 112". There is a gap 12 between two electrode portions 11, 11'. There is a gap 12' between two electrode portions 11, 11". In FIG. 1, the electrode portions 11, 11', 11" may be used for conducting electronically and enhancing the heat dissipation of a light emitting chip (not shown in FIG. 1).

The resin base 2 is formed on the lead frame 1, and the bottom surfaces 112, 112', 112" of the electrode portions 11, 11', 11" may be exposed. The resin base 2 has an outer wall 21 having a top portion 211 thereon and around an edge to form an opening 22, and the opening 22 may expose the top surfaces 111, 111', 111" of the electrode portions 11, 11', 11". In addition, an inner wall 23 extends from the outer wall 21, and the inner wall 23 has a planar top portion 231 and an inner side 232. The planar top portion 231 and the inner side 232 have a junction to form a first corner line 233. The top portion 231 of the inner wall 23 is lower than the top portion 211 of the outer wall 21. The inner side 232 of the inner wall 23 has a slope to decrease the inner diameter of the opening 22 gradually. Also, a circular groove 24 is formed between the inner wall 23 and the outer wall 21. When glue (not shown in FIG. 1) is filled into the circular groove 24, the circular groove 24 can prevent glue from flowing over the outer wall 21.

Figure 2:
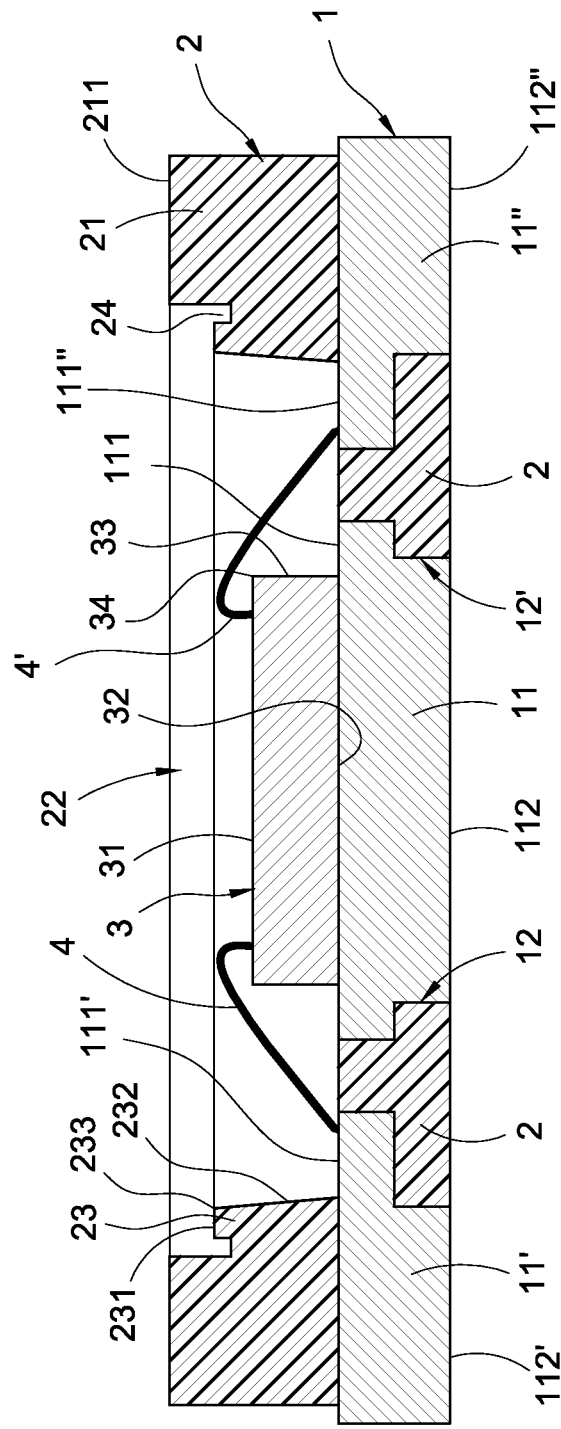
FIG. 2 is a cross sectional view of die bonding and wire bonding of LED according to the invention.

Please refer to FIG. 2. FIG. 2 is a cross sectional view of die bonding and wire bonding of LED according to the invention. As shown in FIG. 2, after the lead frame 1 and the resin base 2 of LED are completed, an emitting chip 3 is attached on the top surface 111 of the electrode portion 11. The emitting chip 3 has a top surface 31, a bottom surface 32 and two side surfaces 33, 33 connecting the top surface 31 and the bottom surface 32. The top surface 31 and one of the side surface 33 have a junction to form a second corner line 34. After the emitting chip 3 is attached on the top surface 111 of the electrode portion 11 with the bottom surface 32, the top surface 31 of the emitting chip 3 is lower than the top portion 231 of the inner wall 23. In FIG. 2, the emitting chip 3 may be omnidirectional type or vertical cavity surface type.

After the emitting chip 3 is attached on the top surface 111 of the electrode portion 11, one wire 4 is connected electrically to the top surface 31 of the emitting chip 3 with an end, and connected electrically to the top surface 111' of the electrode portion 11' with another end. Also, another wire 4' is connected electrically to the top surface 31 of the emitting chip 3 with an end, and connected electrically to the top surface 111" of the electrode portion 11" with another end.

Also, after die bonding and wire bonding of LED are completed, the two wires 4, 4' are not higher than the outer wall 21 so that the two wires 4, 4' will not damaged as grasping or sucking the resin base 2 of LED in the subsequent processing. Therefore, the damage ratio of the two wires 4, 4' can be reduced.

Figure 3:
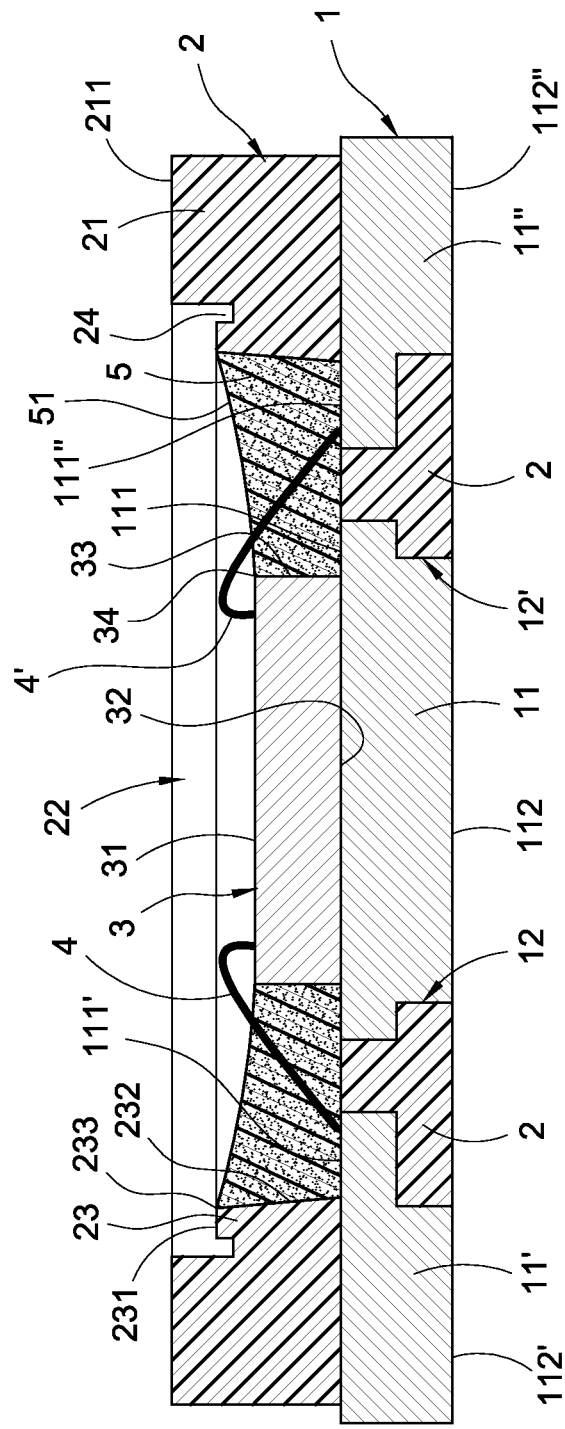
FIG. 3 is a cross sectional view of filling glue of LED according to the invention.

Please refer to FIG. 3. FIG. 3 is a cross sectional view of filling glue of LED according to the invention. As shown in FIG. 3, after die bonding and wire bonding of LED are completed, glue 5 is filled into a space between the emitting chip 3 and the inner wall 23. Because the top portion 231 of the inner wall 23 is higher than the top surface 31 of the emitting chip 3, a surface portion 51 of the glue 5 is slanted from the first corner line 233 of a junction of the top portion 231 and the inner side 232 of the inner wall 23 to the second corner line 34 of a junction of the top surface 31 and one of the side surface 33 of the emitting chip 3. Accordingly, the top surface 31 of the emitting chip 3 and a part of two wires 4, 4' are exposed. When glue 5 is filled into the space between the emitting chip 3 and the inner wall 23, the amount of the glue 5 have to be controlled to form the surface portion 51 of the glue 5 so that the glue 5 will not flow on the top surface 31 of the emitting chip 3 and may fasten the emitting chip 3. In FIG. 3, the glue 5 is transparent, translucent, opaque or white silica gel, epoxy resin or a mixture of silica gel and epoxy resin.

Figure 4:
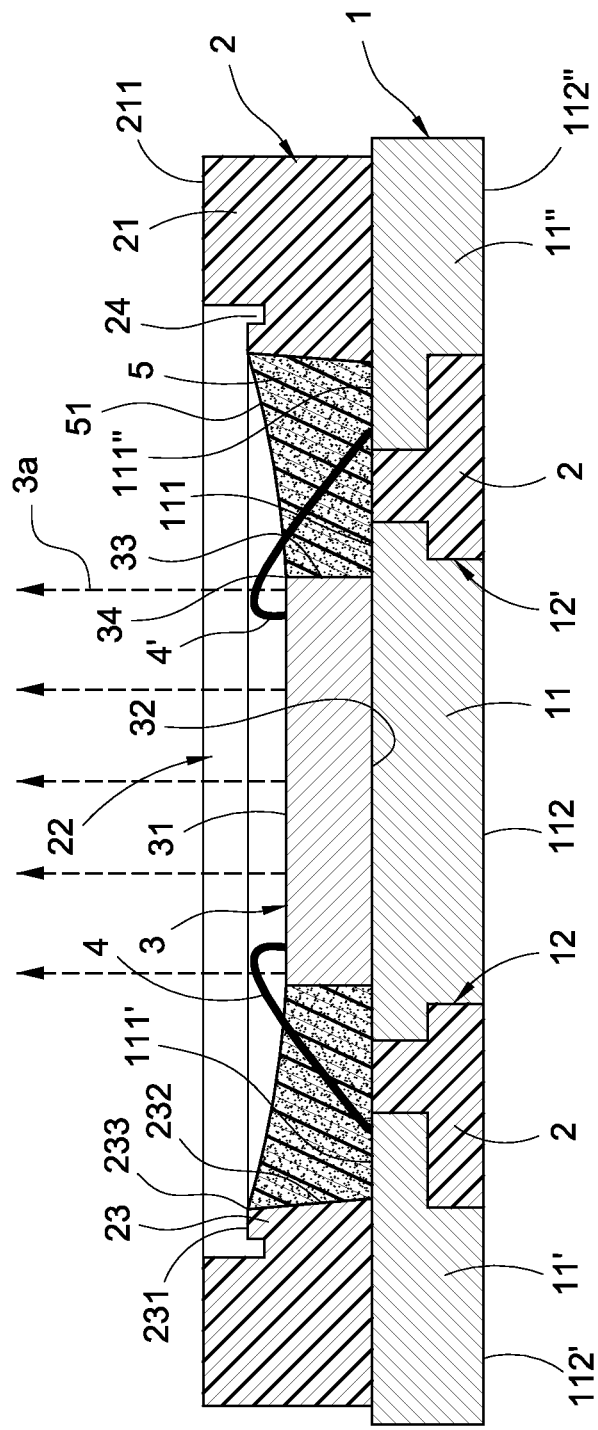
FIG. 4 is a cross sectional view of lighting up LED according to the invention and shows a path of light.

Please refer to FIG. 4. FIG. 4 is a cross sectional view of lighting up LED according to the invention and shows a path of light. As shown in FIG. 4, after filling glue, the emitting chip 3 is exposed so that the light emitted from the emitting chip 3 will not influenced by the glue 5, and the illumination of LED can be enhanced. In FIG. 4, the emitting chip 3 is vertical cavity surface type, and the suitable glue 5 is translucent, opaque or white silica gel, epoxy resin or a mixture of silica gel and epoxy resin. The light 3a emitted from the emitting chip 3 can directly radiate on an object.

Figure 5:
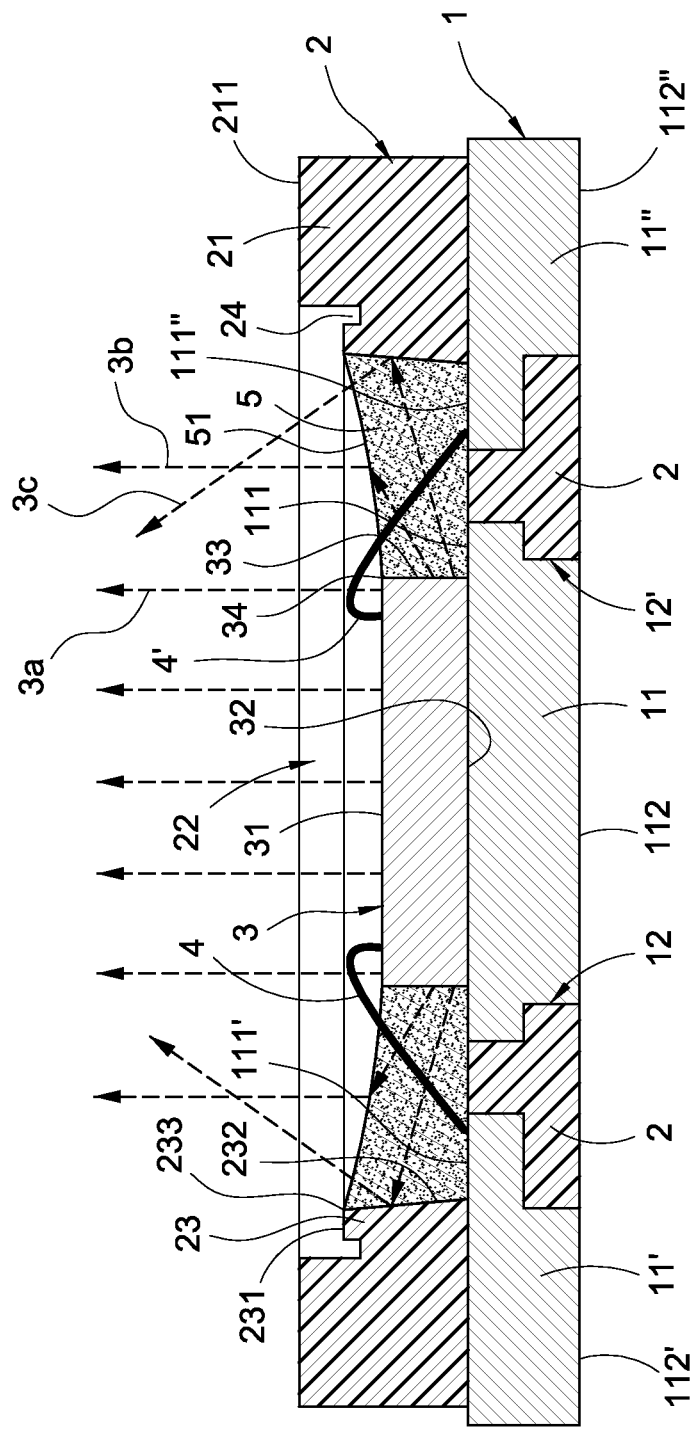
FIG. 5 is a cross sectional view of lighting up LED according to the invention and shows another path of light.

Please refer to FIG. 5. FIG. 5 is a cross sectional view of lighting up LED according to the invention and shows another path of light. As shown in FIG. 5, after filling glue, the emitting chip 3 is exposed so that the light emitted from the emitting chip 3 will not influenced by the glue 5, and the illumination of LED can be enhanced. In FIG. 5, the emitting chip 3 is omnidirectional type, and the suitable glue 5 is transparent silica gel, epoxy resin or a mixture of silica gel and epoxy resin. The light 3a emitted from a surface of the emitting chip 3 can directly radiate on an object, and the light 3b and the light 3c emitted from a side surface of the emitting chip 3 may through the glue 5 to radiate on the object.

Figure 6:
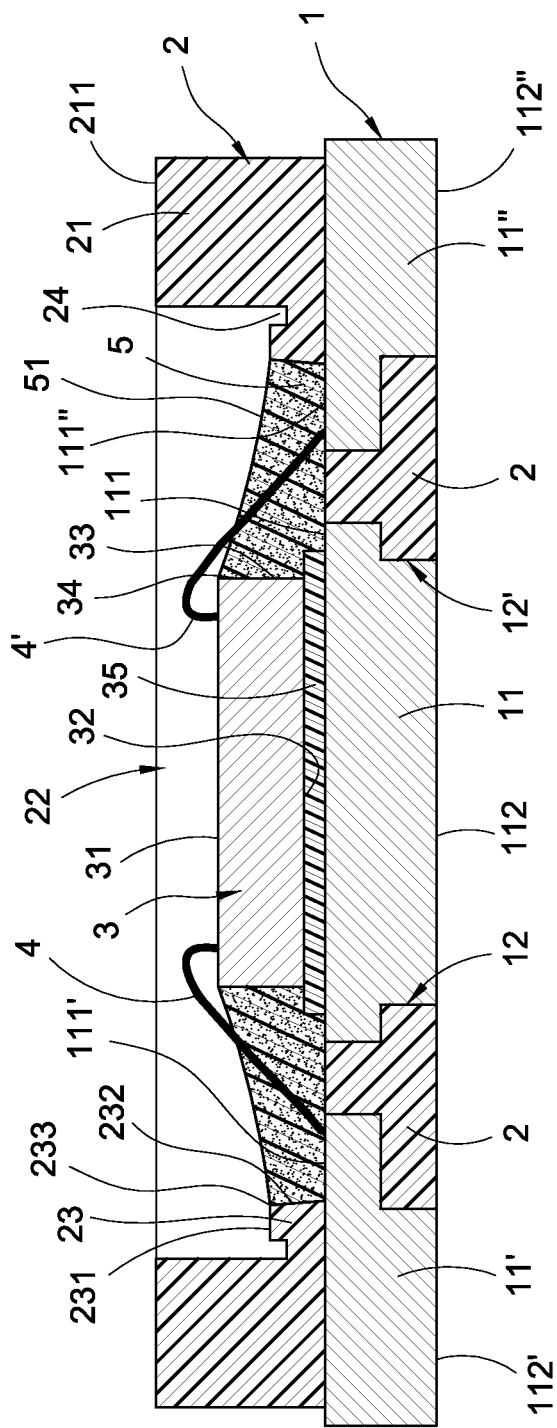
FIG. 6 is a cross sectional view of LED of another embodiment according to the invention.

Please refer to FIG. 6. FIG. 6 is a cross sectional view of LED of another embodiment according to the invention. As shown in FIG. 6, the present embodiment has a structure similar to FIG. 1 to FIG. 5 except that the emitting chip 3 has a submount 35 to attach the emitting chip 3 on the electrode portion 11, and the second corner line 34 of the emitting chip 3 is higher than the first corner line 233 of the inner wall 23. As the glue 5 is filled into a space between the emitting chip 3 and the inner wall 23, because the top surface 31 of the emitting chip 3 is higher than the top portion 231 of the inner wall 23, the surface portion 51 of the glue 5 is slanted from the second corner line 34 of a junction of the top surface 31 and one of the side surface 33 of the emitting chip 3 to the first corner line 233 of a junction of the top portion 231 and the inner side 232 of the inner wall 23. Accordingly, the top surface 31 of the emitting chip 3 and a part of two wires 4, 4' are exposed. The submount 35 in FIG. 6 can be used in the structures of FIG. 1 to FIG. 5.

Figure 7:
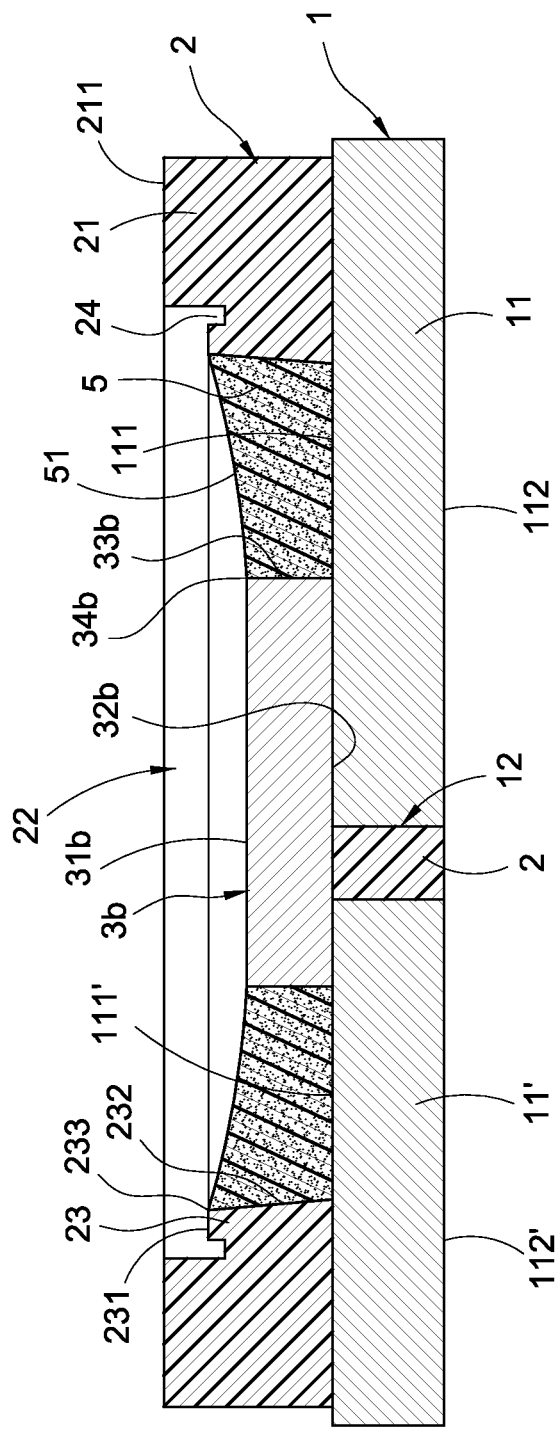
FIG. 7 is a cross sectional view of LED of further embodiment according to the invention.

Please refer to FIG. 7. FIG. 7 is a cross sectional view of LED of further embodiment according to the invention. As shown in FIG. 7, the present embodiment has a structure similar to FIG. 1 to FIG. 5 except that the emitting chip 3 is flip chip type. The emitting chip 3b is attached on the electrode portions 11, 11' with the bottom surface 32b, the top surface 31b of the emitting chip 3b is lower than the top portion 231 of the inner wall 23. The surface portion 51 of the glue 5 is slanted from the first corner line 233 of a junction of the top portion 231 and the inner side 232 of the inner wall 23 to the second corner line 34b of a junction of the top surface 31b and one of the side surface 33b of the emitting chip 3b. Accordingly, the top surface 31b of the emitting chip 3b is exposed.

Figure 8:
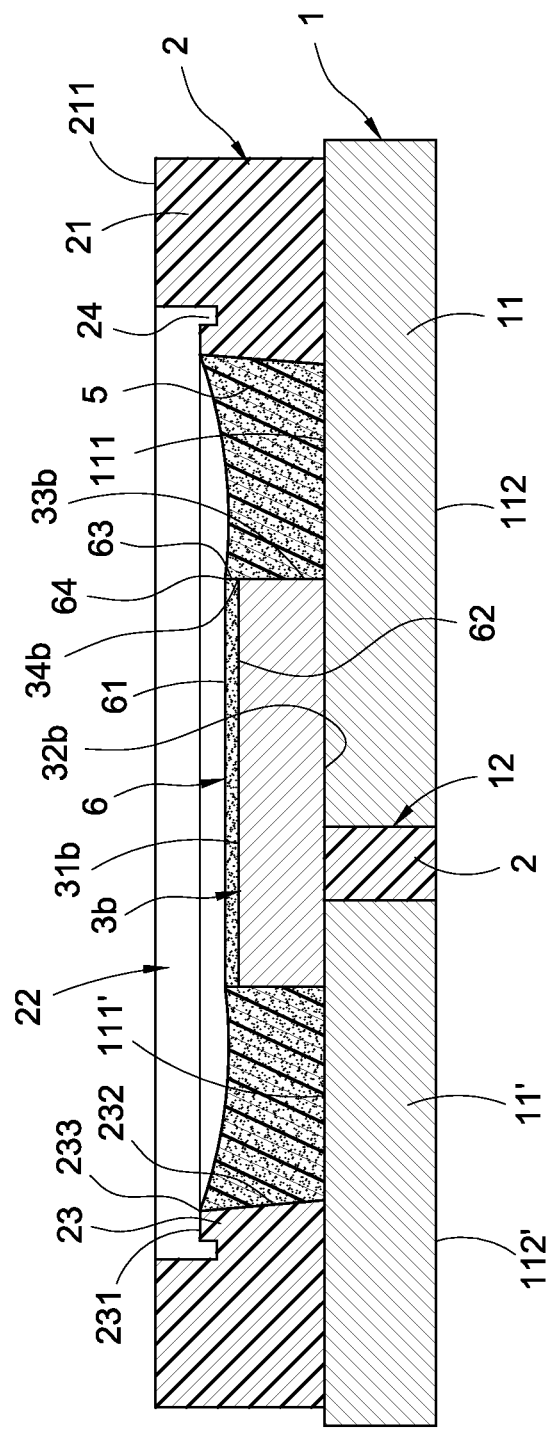
FIG. 8 is a cross sectional view of LED of still embodiment according to the invention.

Please refer to FIG. 8. FIG. 8 is a cross sectional view of LED of still embodiment according to the invention. As shown in FIG. 8, the present embodiment has a structure similar to FIG. 7 except that the flip chip type emitting chip 3b has a fluorescent layer 6 on the top surface 31b. The fluorescent layer 6 has a top surface 61, a bottom surface 62 and two side surfaces 63, 63 connecting the top surface 61 and the bottom surface 62. The top surface 61 and the side surface 63 have a junction to form a third corner line 64. The top surface 61 of the fluorescent layer 6 is lower than the top portion 231 of the inner wall 23. The surface portion 51 of the glue 5 is slanted from the first corner line 233 of a junction of the top portion 231 and the inner side 232 of the inner wall 23 to the third corner line 64 of a junction of the top surface 61 and the side surface 63 of the fluorescent layer 6. Accordingly, the top surface 61 of the fluorescent layer 6 is exposed.

Figure 9:
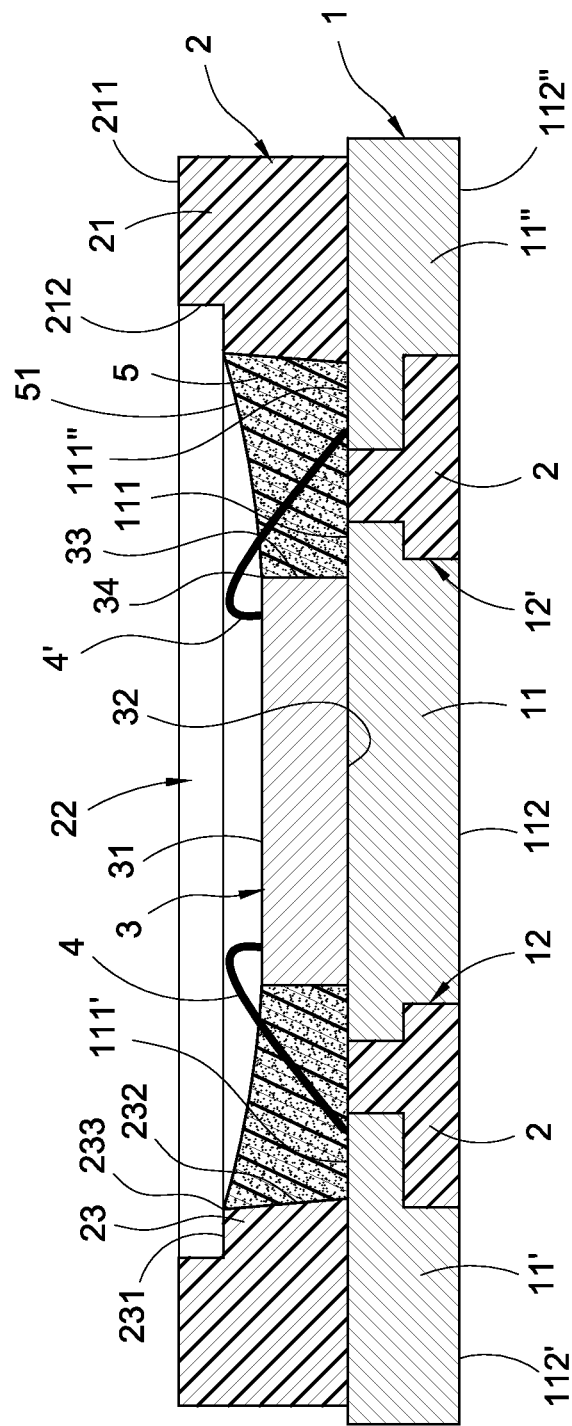
FIG. 9 is a cross sectional view of LED of still another embodiment according to the invention.

Please refer to FIG. 9. FIG. 9 is a cross sectional view of LED of still another embodiment according to the invention. As shown in FIG. 9, the present embodiment has a structure similar to FIG. 3 except that the top portion 231 of the inner wall 23 extends from the outer wall 21, and connects to the inner side 212 of the outer wall 21. When the glue 5 is filled into the space between the emitting chip 3 and the inner wall 23, the top portion 231 of the inner wall 23 can prevent the glue 5 from flowing over the outer wall 21.

Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A light emitting diode package, comprising:
a lead frame (1) having a plurality of electrode portions (11, 11', 11") thereon, each of the electrode portions (11, 11', 11") having a top surface (111, 111', 111") and a bottom surface (112, 112' 112"), and a gap (12) provided between every two electrode portions (11, 11');
a resin base (2) provided on the lead frame (1), and the bottom surfaces (112, 112' 112") of the electrode portions (11, 11', 11") being exposed, the resin base (2) having an outer wall (21) with a top portion (211) thereon and around an edge to form an opening (22), and the opening (22) exposing the top surfaces (111, 111', 111") of the electrode portions (11, 11', 11"); and an inner wall (23) extending from the outer wall (21), and the inner wall (23) having a planar top portion (231) and an inner side (232), wherein the planar top portion (231) and the inner side (232) have a junction to form a first corner line (233), and the top portion (231) of the inner wall (23) is lower than the top portion (211) of the outer wall (21), and the inner side (232) of the inner wall (23) has a slope to decrease the inner diameter of the opening (22) gradually;
an emitting chip (3) attached on the top surface(s) (111, 111', 111") of one or two the electrode portion(s) (11, 11', 11"), the emitting chip (3) having a top surface (31), a bottom surface (32) and two side surfaces (33, 33) connecting the top surface (31) and the bottom surface (32), wherein the top surface (31) and one of the side surfaces (33, 33) have a junction to form a second corner line (34); and
a glue (5) filled into a space between the emitting chip (3) and the inner wall (23), the glue (5) having a surface portion (51) between the first corner line (233) of the inner wall (23) and the second corner line (34) of the emitting chip (3) to expose the top surface (31) of the emitting chip (3),
wherein a circular groove (24) is formed between the inner wall (23) and the outer wall (21) to prevent the glue (5) from flowing over the outer wall (21), and the top surface (31) of the emitting chip (3) is exposed from the light emitting diode package.

2. The light emitting diode package of claim 1, wherein the emitting chip (3) is omnidirectional type, vertical cavity surface type or flip chip type.

3. The light emitting diode package of claim 2, wherein the glue (5) is a transparent, translucent, or opaque material made of white silica gel, epoxy resin or a mixture of silica gel and epoxy resin.

4. The light emitting diode package of claim 3, wherein the emitting chip (3) has a submount (35) to attach the emitting chip (3) on the top surface (111) of the electrode portion (11).

5. The light emitting diode package of claim 4, wherein the emitting chip (3) further has a fluorescent layer (6) on the top surface (31b), wherein the fluorescent layer (6) has a top surface (61), a bottom surface (62) and two side surfaces (63, 63) connecting the top surface (61) and the bottom surface (62), and the top surface (61) and one of the side surfaces (63, 63) have a junction to form a third corner line (64).

6. The light emitting diode package of claim 5, wherein the top surface (61) of the fluorescent layer (6) is lower than the top portion (231) of the inner wall (23) so that the surface portion (51) of the glue (5) can be slanted from the first corner line (233) of a junction of the top portion (231) and the inner side (232) of the inner wall (23) to the third corner line (64) of a junction of the top surface (61) and the side surface (63) of the fluorescent layer (6) to expose the top surface (61) of the fluorescent layer (6).

7. The light emitting diode package of claim 1, further comprising two wires (4, 4'), wherein one wire (4) is connected electrically to the top surface (31) of the emitting chip (3) with an end, and connected electrically to the top surface (111') of one of the electrode portions (11') with another end, and another wire (4') is connected electrically to the top surface (31) of the emitting chip (3) with an end, and connected electrically to the top surface (111") of another electrode portion (11") with another end, and the two wires (4, 4') are not higher than the outer wall (21).

8. The light emitting diode package of claim 7, wherein the top portion (231) of the inner wall (23) is higher than the top surface (31) of the emitting chip (3) so that the surface portion (51) of the glue (5) can be slanted from the first corner line (233) of a junction of the top portion (231) and the inner side (232) of the inner wall (23) to the second corner line (34) of a junction of the top surface (31) and one of the side surfaces

(33) of the emitting chip (3) to expose the top surface (31) of the emitting chip (3) and a part of two wires (4, 4').

9. The light emitting diode package of claim 7, wherein the top surface (31) of the emitting chip (3) is higher than the top portion (231) of the inner wall (23) so that the surface portion (51) of the glue (5) can be slanted from the second corner line (34) of a junction of the top surface (31) and one of the side surfaces (33) of the emitting chip (3) to the first corner line (233) of a junction of the top portion (231) and the inner side (232) of the inner wall (23) to expose the top surface (31) of the emitting chip (3) and a part of two wires (4, 4').

\* \* \* \* \*